(12) United States Patent
Tanaka et al.

(10) Patent No.: US 12,513,959 B2
(45) Date of Patent: Dec. 30, 2025

(54) SEMICONDUCTOR DEVICE (71) Applicants: KABUSHIKI KAISHA TOSHIBA, Tokyo (JP); TOSHIBA ELECTRONIC DEVICES & STORAGE CORPORATION, Tokyo (JP)

(72) Inventors: Katsuhisa Tanaka, Himeji Hyogo (JP); Hiroshi Kono, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 613 days.

(21) Appl. No.: 17/864,163

(22) Filed: Jul. 13, 2022

(65) Prior Publication Data

US 2023/0299150 A1 Sep. 21, 2023

(30) Foreign Application Priority Data

Mar. 17, 2022 (JP) ................................. 2022-042059

(51) Int. Cl.
*H10D 62/60* (2025.01)

(52) U.S. Cl.
CPC .................................. *H10D 62/60* (2025.01)

(58) Field of Classification Search
CPC ......... H10D 62/60–605; H10D 30/668; H10D 62/153; H10D 62/157; H10D 62/159;
(Continued)

(56) References Cited

U.S. PATENT DOCUMENTS 5,072,266 A * 12/1991 Bulucea ............... H10D 62/393
257/E29.066
7,601,603 B2 10/2009 Yamauchi et al.
(Continued)

FOREIGN PATENT DOCUMENTS

JP 2005-317905 A 11/2005
JP 2007-096138 A 4/2007
(Continued)

OTHER PUBLICATIONS

Notice of Reasons for Refusal (Office Action) mailed Apr. 22, 2025, in counterpart Japanese Patent Application No. 2022-042059, with English machine translation, 14 pages.

*Primary Examiner* — Shahed Ahmed
(74) *Attorney, Agent, or Firm* — Kim & Stewart LLP (57) ABSTRACT

According to one embodiment, a semiconductor device includes first and second electrodes, first to fifth semiconductor regions, and a gate electrode. The first semiconductor region is located on the first electrode. The first semiconductor region includes a first region. The gate electrode is located on the first semiconductor region with a gate insulating layer interposed. The second semiconductor region faces the gate electrode via the gate insulating layer in a second direction perpendicular to a first direction. The third semiconductor region is located between the first and second semiconductor regions. A length in the second direction of a lower portion of the third semiconductor region is greater than a length in the second direction of an upper portion of the third semiconductor region. The fourth semiconductor region is located between the third semiconductor region and the gate electrode. The fifth semiconductor region is located on the second semiconductor region.

7 Claims, 7 Drawing Sheets

(58) Field of Classification Search
CPC .... H10D 62/393; H10D 64/512; H10D 30/63; H10D 30/601–608; H10D 64/025–027; H10D 30/658
See application file for complete search history.

(56) References Cited

U.S. PATENT DOCUMENTS

| | | |
|---|---|---|
| 7,642,178 B2 | 1/2010 | Yamauchi et al. |
| 9,543,428 B2 | 1/2017 | Takeuchi et al. |
| 2010/0044791 A1 | 2/2010 | Hebert |
| 2012/0261714 A1 | 10/2012 | Taketani et al. |
| 2015/0372090 A1 | 12/2015 | Oosawa et al. |
| 2017/0018642 A1 | 1/2017 | Kagata et al. |
| 2020/0266294 A1* | 8/2020 | Okumura .......... H01L 21/02529 |
| 2021/0005744 A1 | 1/2021 | Ebihara et al. |
| 2021/0036116 A1 | 2/2021 | Kyogoku et al. |

FOREIGN PATENT DOCUMENTS

| | | |
|---|---|---|
| JP | 2012238834 A | 12/2012 |
| JP | 2014-017469 A | 1/2014 |
| JP | 2015-195345 A | 11/2015 |
| JP | 2019165217 A | 9/2019 |
| JP | 2019216224 A | 12/2019 |
| JP | 2021-027138 A | 2/2021 |
| WO | 2019/181962 A1 | 9/2019 |

\* cited by examiner

SEMICONDUCTOR DEVICE

CROSS-REFERENCE TO RELATED APPLICATIONS

This application is based upon and claims the benefit of priority from Japanese Patent Application No. 2022-042059, filed on Mar. 17, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs) and the like are used in applications such as power conversion and the like. Technology that can improve the short-circuit withstand capacity of semiconductor devices is desirable.

DETAILED DESCRIPTION

According to one embodiment, a semiconductor device includes a first electrode, a first semiconductor region, a gate electrode, a second semiconductor region of a second conductivity type, a third semiconductor region of the second conductivity type, a fourth semiconductor region of a first conductivity type, a fifth semiconductor region of the first conductivity type, and a second electrode. The first semiconductor region is located on the first electrode. The first semiconductor region includes a first region of the first conductivity type. The gate electrode is located on the first semiconductor region with a gate insulating layer interposed. The second semiconductor region faces the gate electrode via the gate insulating layer in a second direction perpendicular to a first direction. The first direction is from the first electrode toward the first semiconductor region. The third semiconductor region is located between the first semiconductor region and the second semiconductor region in the first direction. A length in the second direction of a lower portion of the third semiconductor region is greater than a length in the second direction of an upper portion of the third semiconductor region. The fourth semiconductor region is located between the third semiconductor region and the gate electrode. A first-conductivity-type impurity concentration of the fourth semiconductor region is greater than a first-conductivity-type impurity concentration of the first region. The fifth semiconductor region is located on the second semiconductor region. The second electrode is located on the second and fifth semiconductor regions.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

Figure 1:
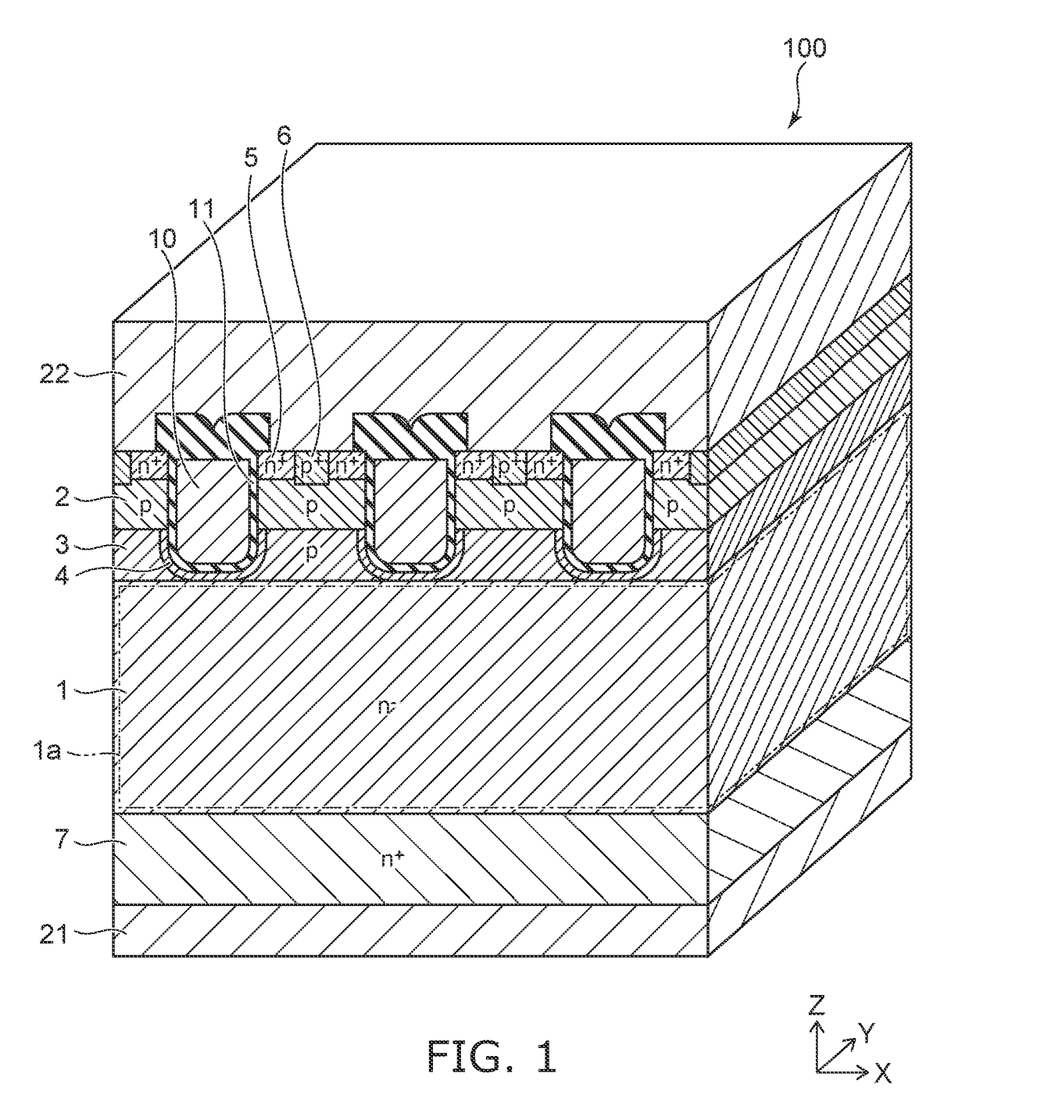
FIG. 1 is a perspective cross-sectional view showing a portion of a semiconductor device according to an embodiment.

FIG. 1 is a perspective cross-sectional view showing a portion of a semiconductor device according to an embodiment.

The semiconductor device according to the embodiment is a MOSFET. As shown in FIG. 1, the semiconductor device 100 according to the embodiment includes a semiconductor region 1 (a first semiconductor region), a p-type (second-conductivity-type) base region 2 (a second semiconductor region), a p-type semiconductor region 3 (a third semiconductor region), an n-type (first-conductivity-type) semiconductor region 4 (a fourth semiconductor region), an $n^+$-type source region 5 (a fifth semiconductor region), a $p^+$-type contact region 6, an $n^+$-type drain region 7, a gate electrode 10, a drain electrode 21 (a first electrode), and a source electrode 22 (a second electrode).

An XYZ orthogonal coordinate system is used in the description of the embodiments. The direction from the drain electrode 21 toward the semiconductor region 1 is taken as a Z-direction (a first direction). One direction perpendicular to the Z-direction is taken as an X-direction (a second direction). A direction perpendicular to the X-direction and the Z-direction is taken as a Y-direction (a third direction). Herein, the direction from the drain electrode 21 toward the semiconductor region 1 is called "up", and the opposite direction is called "down". These directions are based on the relative positional relationship between the drain electrode 21 and the semiconductor region 1 and are independent of the direction of gravity.

The drain electrode 21 is located at the lower surface of the semiconductor device 100. The $n^+$-type drain region 7 is located on the drain electrode 21 and electrically connected with the drain electrode 21. The semiconductor region 1 is located on the n⁺-type drain region 7. The gate electrode 10 is located on the semiconductor region 1 with a gate insulating layer 11 interposed.

The semiconductor region 1 includes an n-type first region 1a. In the semiconductor device 100 according to the embodiment, the first region 1a is located over the entire semiconductor region 1. The n-type impurity concentration of the first region 1a is less than the n-type impurity concentration of the n⁺-type drain region 7. The first region 1a is electrically connected with the drain electrode 21 via the n⁺-type drain region 7.

The p-type base region 2 is located at the upper side of the semiconductor region 1 and faces the gate electrode 10 via the gate insulating layer 11 in the X-direction. The p-type semiconductor region 3 is located between the semiconductor region 1 and the p-type base region 2 in the Z-direction. The n-type semiconductor region 4 is located between the p-type semiconductor region 3 and the gate electrode 10 and between the first region 1a and the gate electrode 10. The n⁺-type source region 5 and the p⁺-type contact region 6 are located selectively on the p-type base region 2. In the illustrated example, the gate electrode 10 faces both a portion of the n-type semiconductor region 4 and a portion of the n⁺-type source region 5 via the gate insulating layer 11 in the X-direction. The first region 1a of the semiconductor region 1 is positioned between the n⁺-type drain region 7 and the gate electrode 10 and between the n⁺-type drain region 7 and the p-type semiconductor region 3.

The source electrode 22 is located on the n⁺-type source region 5 and the p⁺-type contact region 6 and electrically connected with the n⁺-type source region 5 and the p⁺-type contact region 6. The p-type base region 2 is electrically connected with the source electrode 22 via the p⁺-type contact region 6. The gate electrode 10 is electrically isolated from the source electrode 22 by the gate insulating layer 11.

Figure 2:
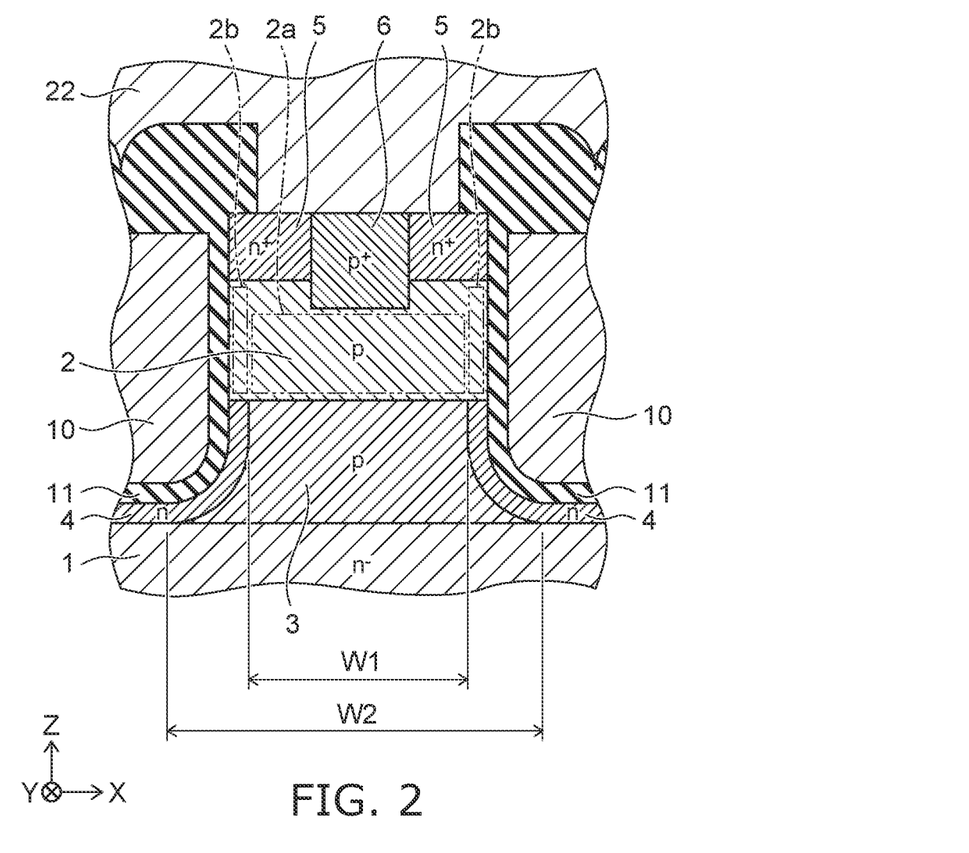
FIG. 2 is an enlarged cross-sectional view of a portion of FIG. 1.

FIG. 2 is an enlarged cross-sectional view of a portion of FIG. 1.

As shown in FIG. 2, a width W2 of the lower portion of the p-type semiconductor region 3 is greater than a width W1 of the upper portion of the p-type semiconductor region 3. The "width" corresponds to the length in the X-direction. In the semiconductor device 100, the lower end of the p-type semiconductor region 3 (the interface between the semiconductor region 1 and the p-type semiconductor region 3) is positioned lower than the lower end of the gate electrode 10. The width of the lower portion of the p-type semiconductor region 3 increases downward; and a portion of the p-type semiconductor region 3 is positioned under the gate insulating layer 11.

The n-type semiconductor region 4 contacts the first region 1a and the gate insulating layer 11. The n-type impurity concentration of the n-type semiconductor region 4 is greater than the n-type impurity concentration of the first region 1a. In the illustrated example, the width of the lower end of the gate electrode 10 decreases downward. The gate insulating layer 11 and the n-type semiconductor region 4 have substantially uniform thicknesses along the side surface and bottom surface of the gate electrode 10. The width of the lower portion of the p-type semiconductor region 3 increases by the amount that the width of the lower end of the gate electrode 10 decreases.

As illustrated, it is favorable for the n-type semiconductor region 4 to be thin along the gate insulating layer 11. For example, the thickness of the n-type semiconductor region 4 is less than the width W1 or W2 of the p-type semiconductor region 3. "The thickness of the n-type semiconductor region 4" corresponds to the length of the n-type semiconductor region 4 in the normal direction of the gate insulating layer 11 surface.

As shown in FIG. 2, the p-type base region 2 may include a first portion 2a and a second portion 2b. The first portion 2a is separated from the gate insulating layer 11 in the X-direction. The second portion 2b is located between the gate insulating layer 11 and the first portion 2a and positioned on the n-type semiconductor region 4. The second portion 2b contacts the gate insulating layer 11. The p-type impurity concentration of the second portion 2b is less than the p-type impurity concentration of the first portion 2a. The p-type impurity concentration of the p-type semiconductor region 3 is less than the p-type impurity concentration of the first portion 2a and greater than the p-type impurity concentration of the second portion 2b.

A plurality of each of the p-type base region 2, the p-type semiconductor region 3, the n-type semiconductor region 4, the n⁺-type source region 5, the p⁺-type contact region 6, and the gate electrode 10 is arranged in the X-direction and extends in the Y-direction. The p-type semiconductor region 3 is positioned between the n-type semiconductor regions 4 that are next to each other in the X-direction. The width of the p-type semiconductor region 3 corresponds to the length in the X-direction from the boundary between the p-type semiconductor region 3 and one n-type semiconductor region 4 and the boundary between the p-type semiconductor region 3 and another n-type semiconductor region 4 next to the one n-type semiconductor region 4.

Operations of the semiconductor device 100 will now be described.

A voltage that is not less than a threshold is applied to the gate electrode 10 in a state in which a positive voltage with respect to the source electrode 22 is applied to the drain electrode 21. Thereby, a channel (an inversion layer) is formed in the p-type base region 2; and the semiconductor device 100 is set to the on-state. Electrons flow from the source electrode 22 toward the n-type semiconductor region 4 via the channel and move toward the drain electrode 21. When the voltage that is applied to the gate electrode 10 drops below the threshold, the channel of the p-type base region 2 disappears, and the semiconductor device 100 switches to the off-state.

Examples of the materials of the components of the semiconductor device 100 will now be described.

The semiconductor region 1, the p-type base region 2, the p-type semiconductor region 3, the n-type semiconductor region 4, the n⁺-type source region 5, the p⁺-type contact region 6, and the n⁺-type drain region 7 include a semiconductor material. Silicon carbide, silicon, gallium nitride, or gallium arsenide can be used as the semiconductor material. Arsenic, phosphorus, antimony, or nitrogen can be used as the n-type impurity. Boron or aluminum can be used as the p-type impurity.

The gate insulating layer 11 includes an electrical insulating material. For example, the gate insulating layer 11 includes silicon oxide, silicon nitride, or silicon oxynitride. The gate electrode 10 includes a conductive material such as polysilicon, etc. An n-type or p-type impurity may be added to the gate electrode 10. The drain electrode 21 and the source electrode 22 include metals such as titanium, tungsten, aluminum, etc.

FIGS. 3A to 5B are cross-sectional views showing manufacturing processes of the semiconductor device according to the embodiment.

Figure 3A:
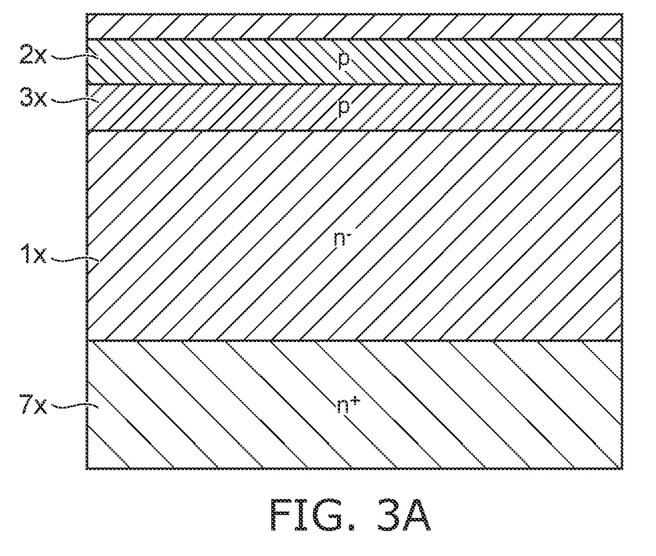
FIGS. 3A and 3B are cross-sectional views showing manufacturing processes of the semiconductor device according to the embodiment.

An example of a method for manufacturing the semiconductor device 100 according to the embodiment will now be described with reference to FIGS. 3A to 5B. First, a semiconductor substrate that includes an $n^+$-type semiconductor layer $7x$ is prepared. An $n^-$-type semiconductor layer $1x$ is formed by epitaxial growth on the $n^+$-type semiconductor layer $7x$. As shown in FIG. 3A, a p-type semiconductor region $2x$ and a p-type semiconductor region $3x$ are formed in the upper portion of the $n^-$-type semiconductor layer $1x$ by ion implantation. The p-type semiconductor region $2x$ and the p-type semiconductor region $3x$ are formed at positions separated from the upper surface of the $n^-$-type semiconductor layer $1x$. The p-type semiconductor region $3x$ is positioned between the $n^-$-type semiconductor layer $1x$ and the p-type semiconductor region $2x$. The p-type impurity concentration of the p-type semiconductor region $2x$ is greater than the p-type impurity concentration of the p-type semiconductor region $3x$.

Figure 3B:
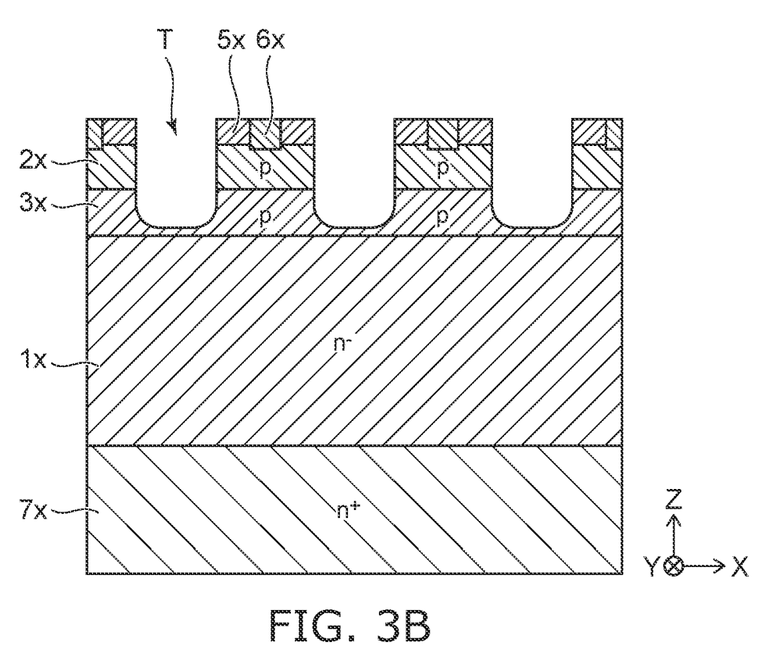

An $n^+$-type semiconductor region $5x$ and a $p^+$-type semiconductor region $6x$ are formed by sequentially ion-implanting an n-type impurity and a p-type impurity into the p-type semiconductor region $2x$. As shown in FIG. 3B, a trench T that extends through the $n^+$-type semiconductor region $5x$ is formed by reactive ion etching (RIE). The trench T does not reach the $n^-$-type semiconductor layer $1x$.

Figure 4A:
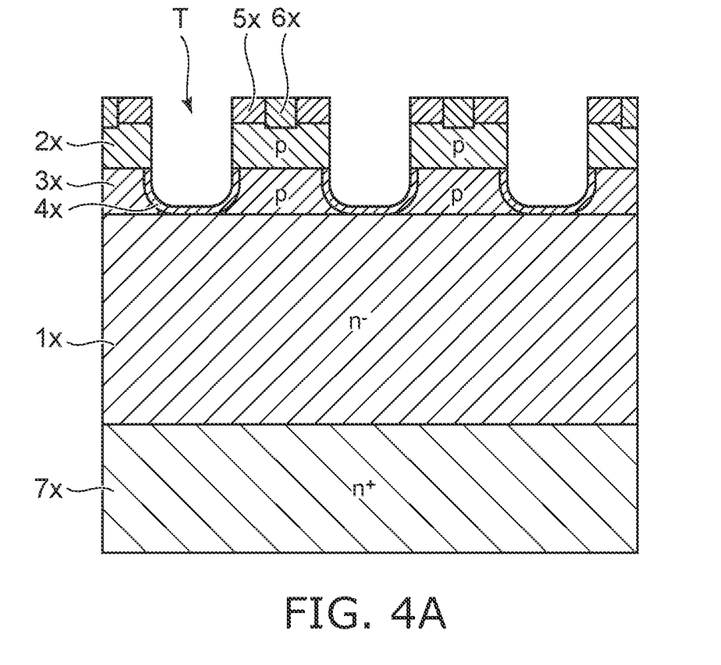
FIGS. 4A and 4B are cross-sectional views showing manufacturing processes of the semiconductor device according to the embodiment.

As shown in FIG. 4A, an n-type impurity is ion-implanted into the inner surface of the trench T. An n-type semiconductor region $4x$ is formed along the inner surface of the trench T by changing the conductivity type of a portion of the p-type semiconductor region $3x$ from the p-type to the n-type. The p-type semiconductor region $2x$ has a higher p-type impurity concentration than the p-type semiconductor region $3x$. Therefore, the conductivity type of the p-type semiconductor region $2x$ is unchanged by the ion implantation for forming the n-type semiconductor region $4x$. Due to the ion implantation, the p-type impurity concentration of the portion of the p-type semiconductor region $2x$ next to the trench T becomes less than the p-type impurity concentration of the portion of the p-type semiconductor region $2x$ separated from the trench T.

Figure 4B:
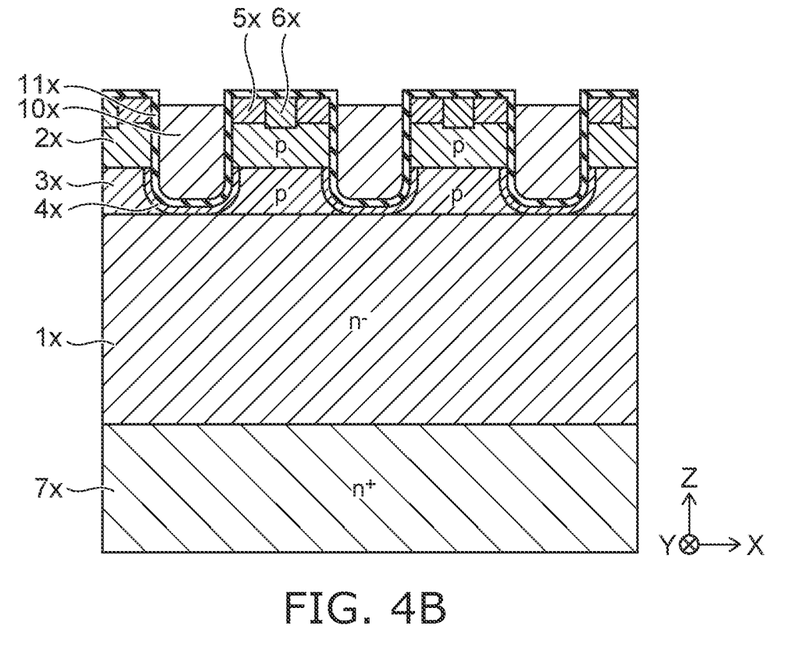

An insulating layer $11x$ is formed along the inner surface of the trench T and the upper surfaces of the semiconductor regions by thermal oxidation. A conductive layer that fills the trench T is formed by chemical vapor deposition (CVD) on the insulating layer $11x$. The upper surface of a conductive layer $10x$ is caused to recede by chemical dry etching (CDE). Thereby, as shown in FIG. 4B, the conductive layer $10x$ is formed inside the trench T.

Figure 5A:
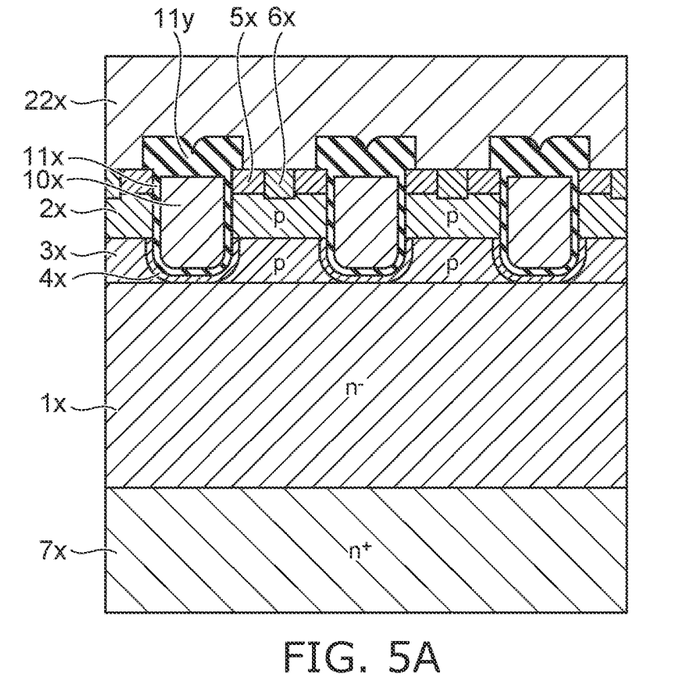
FIGS. 5A and 5B are cross-sectional views showing manufacturing processes of the semiconductor device according to the embodiment.

An insulating layer $11y$ that covers the conductive layer $10x$ is formed. The $n^+$-type semiconductor region $5x$ and the $p^+$-type semiconductor region $6x$ are exposed by removing a portion of the insulating layer $11x$ and a portion of the insulating layer $11y$ by RIE. As shown in FIG. 5A, a metal layer $22x$ is formed on the insulating layer $11y$.

Figure 5B:
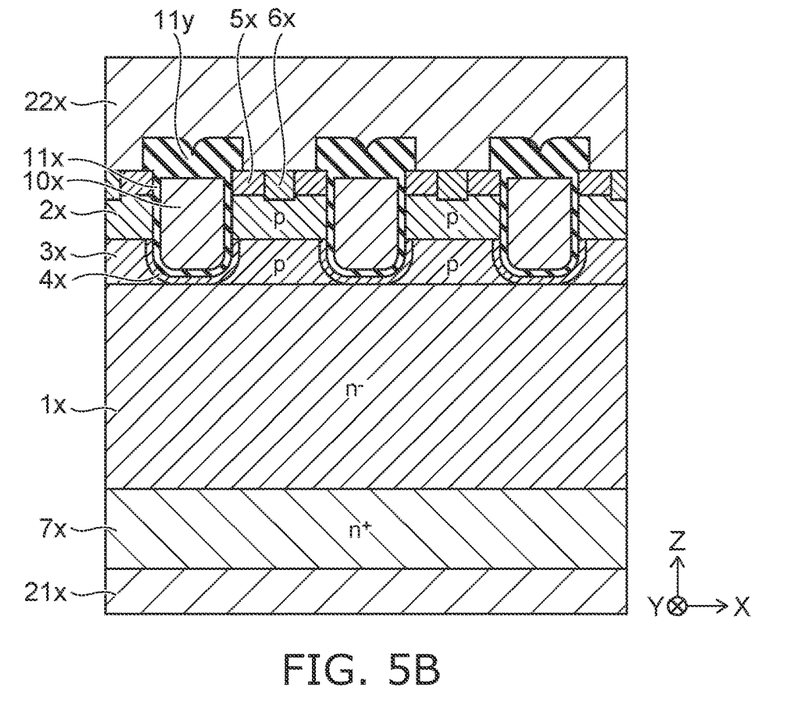

The lower surface of the $n^+$-type semiconductor layer $7x$ is polished until the $n^+$-type semiconductor layer $7x$ has a prescribed thickness. As shown in FIG. 5B, a metal layer $21x$ is formed under the $n^+$-type semiconductor layer $7x$. The semiconductor device 100 shown in FIG. 1 is manufactured by the processes described above.

The $n^-$-type semiconductor layer $1x$ shown in FIG. 5B corresponds to the first region $1a$ of the semiconductor region 1 shown in FIG. 1. The p-type semiconductor region $2x$ corresponds to the p-type base region 2. The p-type semiconductor region $3x$ corresponds to the p-type semiconductor region 3. The n-type semiconductor region $4x$ corresponds to the n-type semiconductor region 4. The $n^+$-type semiconductor region $5x$ corresponds to the $n^+$-type source region 5. The $p^+$-type semiconductor region $6x$ corresponds to the $p^+$-type contact region 6. The $n^+$-type semiconductor layer $7x$ corresponds to the $n^+$-type drain region 7. The conductive layer $10x$ corresponds to the gate electrode 10. The insulating layers $11x$ and $11y$ correspond to the gate insulating layer 11. The metal layer $21x$ corresponds to the drain electrode 21. The metal layer $22x$ corresponds to the source electrode 22.

Advantages of the embodiment will now be described.

A load is connected in series with the semiconductor device 100 when the semiconductor device 100 is connected with an external circuit. When the semiconductor device 100 is in the on-state, the voltage that is applied to the semiconductor device 100 can be reduced by the occurrence of a voltage drop of the load. A high voltage is applied to the semiconductor device 100 when a short-circuit occurs in the load. It is desirable for the time to be long from the application of the high voltage until breakdown of the semiconductor device 100 occurs. In other words, a high short-circuit withstand capacity is desirable.

In the semiconductor device 100, the p-type semiconductor region 3 is located between the semiconductor region 1 and the p-type base region 2. The n-type semiconductor region 4 is located between the p-type semiconductor region 3 and the gate electrode 10. When the semiconductor device 100 is in the on-state, a current flows through the n-type semiconductor region 4. When the load is shorted and a high voltage is applied to the semiconductor device 100, a depletion layer spreads toward the n-type semiconductor region 4 from the p-n junction between the p-type semiconductor region 3 and the n-type semiconductor region 4. The path of the current is confined thereby. The current that flows through the semiconductor device 100 is reduced, and a temperature rise is suppressed.

In particular, in the semiconductor device 100, the width W2 of the lower portion of the p-type semiconductor region 3 is greater than the width W1 of the upper portion of the p-type semiconductor region 3; and the n-type semiconductor region 4 is thin along the gate insulating layer 11. Therefore, the current path is easily confined when a short-circuit of the load occurs, and the short-circuit withstand capacity can be improved. The n-type impurity concentration of the n-type semiconductor region 4 is greater than the n-type impurity concentration of the first region $1a$. Therefore, even when the thickness of the n-type semiconductor region 4 is thin, the electrical resistance in the n-type semiconductor region 4 can be reduced, and the increase of the on-resistance of the semiconductor device 100 can be suppressed. According to the embodiment, the short-circuit withstand capacity of the semiconductor device 100 can be improved while suppressing the increase of the on-resistance of the semiconductor device 100.

As shown in FIG. 4A, the n-type semiconductor region 4 can be self-aligningly formed with respect to the trench T by ion-implanting via the trench T. Even when the spacing between the gate electrodes 10 is reduced and the structure of the semiconductor device 100 is downscaled, the fluctuation of the width of the p-type semiconductor region 3, the thickness of the n-type semiconductor region 4, the positional relationship between the p-type semiconductor region 3 and the n-type semiconductor region 4, etc., can be reduced. According to the embodiment, even when the structure of the semiconductor device 100 is downscaled, the fluctuation of the short-circuit withstand capacity can be reduced, and the reliability of the semiconductor device 100 can be increased.

Favorably, the p-type base region 2 includes the first portion $2a$ and the second portion $2b$ that have mutuallydifferent p-type impurity concentrations. The second portion 2b is positioned between the gate insulating layer 11 and the first portion 2a. The electrical resistance of the channel can be reduced by setting the p-type impurity concentration of the second portion 2b to be less than the p-type impurity concentration of the first portion 2a. The reduction of the threshold voltage for setting the semiconductor device 100 to the on-state can be suppressed by setting the p-type impurity concentration of the first portion 2a to be greater than the p-type impurity concentration of the second portion 2b. For example, a misoperation of the semiconductor device 100 due to a reduction of the threshold voltage can be suppressed.

It is favorable for the p-type impurity concentration of the p-type semiconductor region 3 to be less than the p-type impurity concentration of the first portion 2a of the p-type base region 2. The semiconductor device 100 includes a body diode made of the first region 1a and the p-type semiconductor region 3. The change of the impurity concentration at the p-n junction vicinity between the first region 1a and the p-type semiconductor region 3 can be suppressed by setting the p-type impurity concentration of the p-type semiconductor region 3 to be less than the p-type impurity concentration of the first portion 2a of the p-type base region 2. For example, when the body diode of the semiconductor device 100 operates when switching, the capacitance change of the body diode becomes mild, and the noise can be reduced. In other words, the operation of the body diode can be further stabilized.

First Modification

Figure 6:
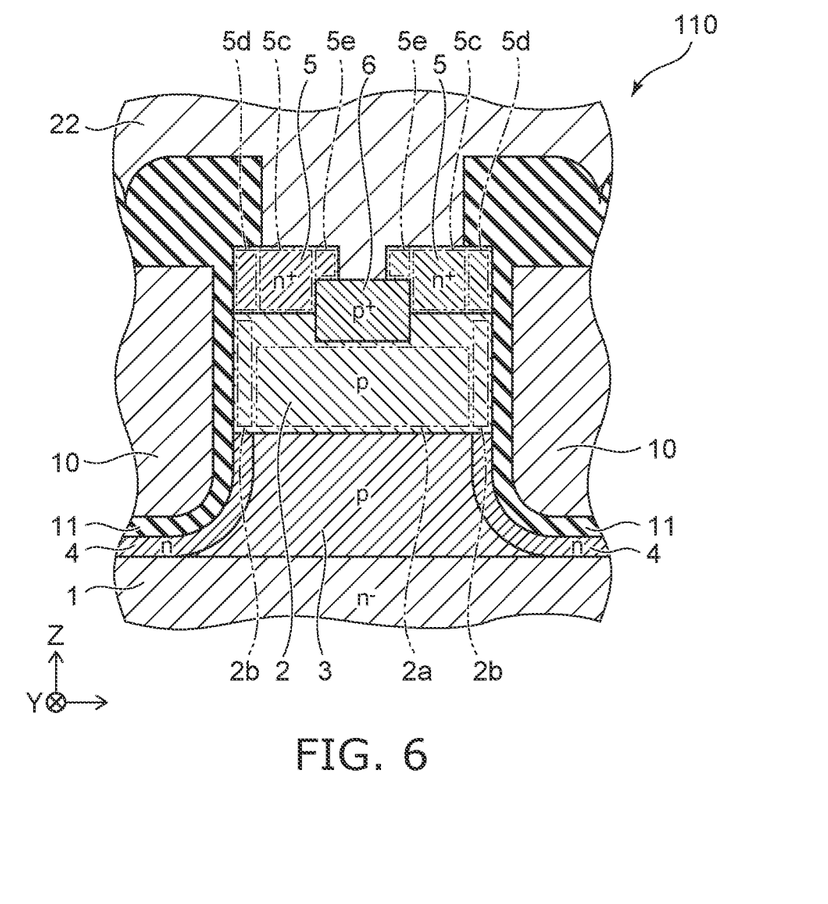
FIG. 6 is a cross-sectional view showing a portion of a semiconductor device according to a first modification of the embodiment.

FIG. 6 is a cross-sectional view showing a portion of a semiconductor device according to a first modification of the embodiment.

The semiconductor device 110 shown in FIG. 6 has a different $n^+$-type source region 5 structure than the semiconductor device 100. As shown in FIG. 6, the $n^+$-type source region 5 includes a third portion 5c and a fourth portion 5d. The third portion 5c is separated from the gate insulating layer 11 in the X-direction and positioned on the first portion 2a. The fourth portion 5d is located between the gate insulating layer 11 and the third portion 5c and positioned on the n-type semiconductor region 4 and the second portion 2b. The fourth portion 5d contacts the gate insulating layer 11. The n-type impurity concentration of the fourth portion 5d is greater than the n-type impurity concentration of the third portion 5c.

The $n^+$-type source region 5 may further include a fifth portion 5e. The third portion 5c and the fourth portion 5d are positioned between the gate insulating layer 11 and the fifth portion 5e in the X-direction. The fifth portion 5e contacts the source electrode 22. The n-type impurity concentration of the fifth portion 5e is greater than the n-type impurity concentration of the third portion 5c and greater than the n-type impurity concentration of the fourth portion 5d. As illustrated, the length in the Z-direction of the fifth portion 5e may be less than the lengths in the Z-direction of the third and fourth portions 5c and 5d.

The electrical resistance of the third portion 5c is greater than the electrical resistances of the fourth and fifth portions 5d and 5e when the n-type impurity concentration of the third portion 5c is less than the n-type impurity concentrations of the fourth and fifth portions 5d and 5e. By increasing the electrical resistance of the third portion 5c, compared to when the n-type impurity concentration of the entire $n^+$-type source region 5 is reduced, the current that flows through the $n^+$-type source region 5 when a short-circuit occurs can be suppressed can while suppressing the increase of the on-resistance.

Also, the electrical resistance between the $n^+$-type source region 5 and the source electrode 22 can be reduced by the $n^+$-type source region 5 including the fifth portion 5e. The on-resistance of the semiconductor device 110 can be further reduced thereby.

Second Modification

Figure 7:
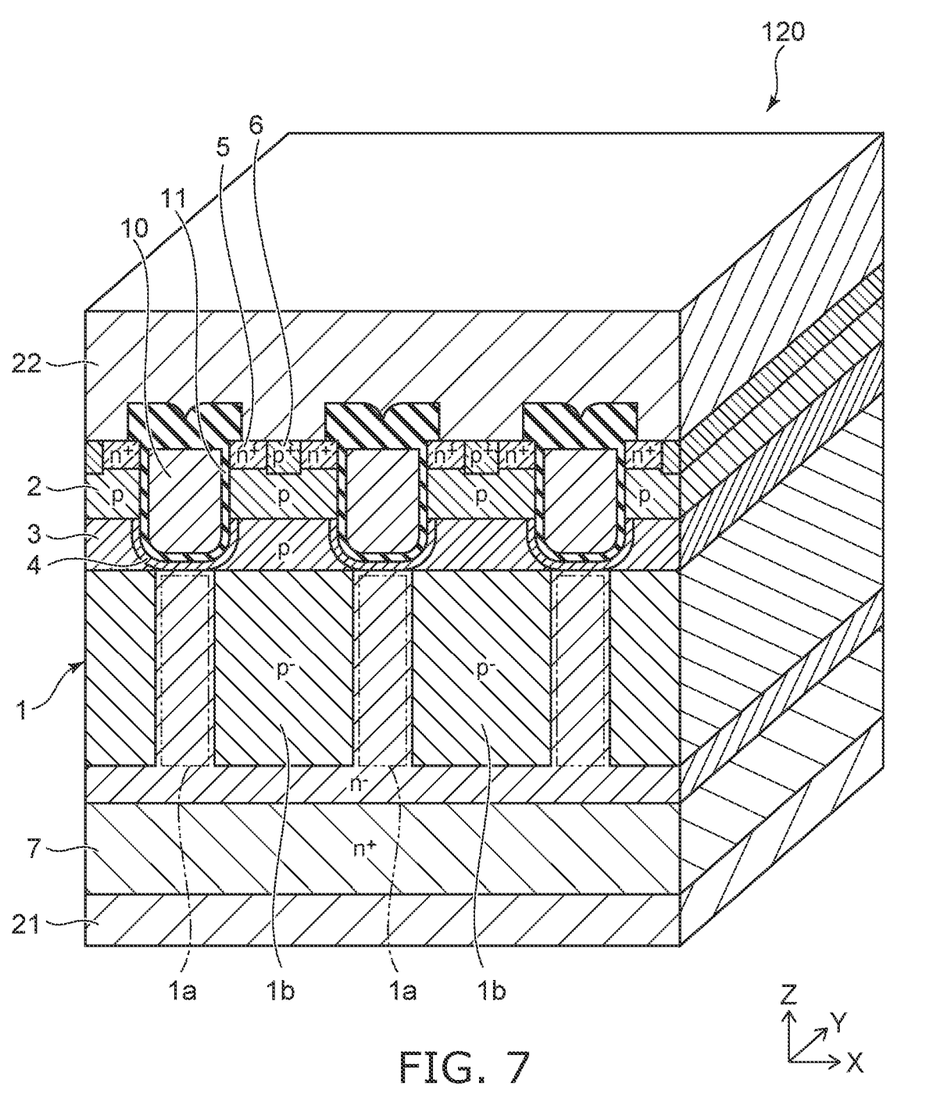
FIG. 7 is a perspective cross-sectional view showing a portion of a semiconductor device according to a second modification of the embodiment.

FIG. 7 is a perspective cross-sectional view showing a portion of a semiconductor device according to a second modification of the embodiment.

The semiconductor device 120 shown in FIG. 7 has a different semiconductor region 1 structure than the semiconductor device 100. As shown in FIG. 7, the semiconductor region 1 includes a second region 1b of the second conductivity type. The first region 1a and the second region 1b are alternately arranged in the X-direction. Each first region 1a and each second region 1b extend in the Y-direction.

A portion of the n-type semiconductor region 4 is positioned on the first region 1a and contacts the first region 1a. The p-type semiconductor region 3 is positioned on the second region 1b and contacts the second region 1b. The p-type impurity concentration of the p-type semiconductor region 3 is greater than the p-type impurity concentration of the second region 1b. For example, the width of the second region 1b is greater than the width of the first region 1a and greater than the width of the upper portion of the p-type semiconductor region 3.

When a high voltage is applied to the semiconductor device 120, a depletion layer spreads not only from the p-n junction between the p-type semiconductor region 3 and the n-type semiconductor region 4 but also from the p-n junction between the first region 1a and the second region 1b. Not only the current path in the n-type semiconductor region 4 but also the current path in the first region 1a is confined. According to the second modification, compared to the semiconductor device 100, the short-circuit withstand capacity of the semiconductor device 120 can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:
1. A semiconductor device, comprising:
a first electrode;
a first semiconductor region located on the first electrode, the first semiconductor region including a first region of a first conductivity type;
a gate electrode located on the first semiconductor region with a gate insulating layer interposed;
a second semiconductor region facing the gate electrode via the gate insulating layer in a second direction perpendicular to a first direction, the first direction being from the first electrode toward the first semicon- ductor region, the second semiconductor region being of a second conductivity type;

a third semiconductor region located between the first semiconductor region and the second semiconductor region in the first direction, the third semiconductor region being of the second conductivity type, a length in the second direction of a lower portion of the third semiconductor region being greater than a length in the second direction of an upper portion of the third semiconductor region;

a fourth semiconductor region located between the third semiconductor region and the gate electrode, the fourth semiconductor region being of the first conductivity type, a first-conductivity-type impurity concentration of the fourth semiconductor region being greater than a first-conductivity-type impurity concentration of the first region;

a fifth semiconductor region located on the second semiconductor region, the fifth semiconductor region being of the first conductivity type; and a second electrode located on the second and fifth semiconductor regions, the second semiconductor region including:
  a first portion separated from the gate insulating layer in the second direction; and
  a second portion located between the gate insulating layer and the first portion and positioned on the fourth semiconductor region, a second-conductivity-type impurity concentration of the second portion being less than a second-conductivity-type impurity concentration of the first portion, the third semiconductor region including a first part positioned between the first semiconductor region and the third semiconductor region in the first direction and a second part positioned between the first semiconductor region and the fourth semiconductor region in the first direction, the second-conductivity-type impurity concentration of the second portion being less than a second-conductivity-type impurity concentration of each of the first part and the second part of the third semiconductor region.

2. The device according to claim 1, wherein
the third semiconductor region includes:
  a third portion separated from the gate insulating layer in the second direction; and
  a fourth portion located between the gate insulating layer and the third portion and positioned on the fourth semiconductor region, and
a first-conductivity-type impurity concentration of the fourth portion is greater than a first-conductivity-type impurity concentration of the third portion.

3. The device according to claim 2, wherein
the third semiconductor region further includes a fifth portion,
the third portion and the fourth portion are positioned between the gate insulating layer and the fifth portion in the second direction, and
a first-conductivity-type impurity concentration of the fifth portion is greater than the first-conductivity-type impurity concentration of the third portion.

4. The device according to claim 1, wherein
the first semiconductor region further includes a second region of the second conductivity type, and
the first region and the second region are alternately arranged in the second direction.

5. The device according to claim 4, wherein
the third semiconductor region contacts one of a plurality of the second regions, and
the fourth semiconductor region contacts one of a plurality of the first regions.

6. The device according to claim 1, wherein
a lower end of the third semiconductor region is positioned lower than a lower end of the gate electrode.

7. The device according to claim 1, wherein
a portion of the third semiconductor region is positioned under the gate insulating layer.

* * * * *